United States Patent
Tian et al.

(10) Patent No.: US 9,851,151 B2
(45) Date of Patent: Dec. 26, 2017

(54) APPARATUS AND METHOD FOR CONTROLLING HEATING OF BASE WITHIN CHEMICAL VAPOUR DEPOSITION CHAMBER

(71) Applicant: Advanced Micro-Fabrication Equipment Inc, Shanghai, Shanghai (CN)

(72) Inventors: Baoxia Tian, Shanghai (CN); Steven Tianxiao Lee, Shanghai (CN); Yingbin Liu, Shanghai (CN); Quanyong Guo, Shanghai (CN)

(73) Assignee: ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 548 days.

(21) Appl. No.: 14/386,765

(22) PCT Filed: Mar. 21, 2013

(86) PCT No.: PCT/CN2013/073002
§ 371 (c)(1),
(2) Date: Sep. 19, 2014

(87) PCT Pub. No.: WO2013/139288
PCT Pub. Date: Sep. 26, 2013

(65) Prior Publication Data
US 2015/0024330 A1   Jan. 22, 2015

(30) Foreign Application Priority Data

Mar. 21, 2012 (CN) .......................... 2012 1 0077039

(51) Int. Cl.
*H05B 1/02* (2006.01)
*F27D 19/00* (2006.01)
(Continued)

(52) U.S. Cl.
CPC .............. *F27D 19/00* (2013.01); *C23C 16/46* (2013.01); *C23C 16/52* (2013.01);
(Continued)

(58) Field of Classification Search
CPC ...... F24D 19/00; F24D 21/0014; F24D 21/04; C23C 16/46; C23C 16/52; H05H 1/26; H05H 1/46; H05B 1/0233; H05B 3/0047
(Continued)

(56) References Cited

U.S. PATENT DOCUMENTS 4,495,402 A * 1/1985 Burdick ................ A47J 27/004
219/214
5,955,033 A * 9/1999 Hayes .................. B01J 19/0013
422/109
(Continued)

FOREIGN PATENT DOCUMENTS

CN     1546723 A    11/2004
CN     1607989 A    4/2005
(Continued)

OTHER PUBLICATIONS

First Office Action for Chinese Patent Application No. 201210077039.4 dated Mar. 27, 2013.
(Continued)

*Primary Examiner* — Mark Paschall
(74) *Attorney, Agent, or Firm* — Womble Bond Dickinson (US) LLP; Joseph Bach, Esq.

(57) ABSTRACT

Provided are an apparatus and a method for controlling the heating of the base within a chemical vapour deposition chamber, which apparatus is applicable to an MOCVD reaction chamber. The apparatus comprises a heater located within a chamber; a tray located near the heater within the chamber and spaced apart from the heater and used for carrying the base; a first temperature control unit coupled
(Continued)

with a surface of the tray for carrying the base and used for measuring the temperature of the tray surface and outputting a first control signal as a function of a set temperature and the temperature of the tray surface; and a second temperature control unit connected to the first temperature control unit and used for measuring the temperature of the middle of the area between the tray and the heater, and also for outputting a second control signal as a function of the first control signal and the temperature of the middle, with the heater being coupled with the second temperature control unit to heat according to the second control signal. Further provided is a method for controlling the heating of the base within a chemical vapour deposition chamber. A steady base temperature can be obtained via the apparatus.

13 Claims, 4 Drawing Sheets

(51) Int. Cl.
  *C23C 16/46* (2006.01)
  *C23C 16/52* (2006.01)
  *F27D 21/00* (2006.01)
  *F27D 21/04* (2006.01)
(52) U.S. Cl.
  CPC ......... *F27D 21/0014* (2013.01); *F27D 21/04* (2013.01); *F27D 2019/0025* (2013.01)
(58) Field of Classification Search
  USPC .............. 219/494, 497, 121.43; 156/345.52; 118/725
  See application file for complete search history.

(56) References Cited

U.S. PATENT DOCUMENTS

| | | | |
|---|---|---|---|
| 6,482,266 | B1 | 11/2002 | Matsumoto et al. |
| 6,492,625 | B1 | 12/2002 | Boguslavskiy et al. |
| 8,151,872 | B2 * | 4/2012 | Di Stefano ............. F25B 49/02 165/101 |
| 8,920,372 | B2 * | 12/2014 | Faries, Jr. ............... A61M 5/44 392/465 |
| 2007/0292598 | A1 | 12/2007 | Tada et al. |
| 2009/0194024 | A1 | 8/2009 | Burrows et al. |
| 2011/0146571 | A1 | 6/2011 | Bartlett et al. |

FOREIGN PATENT DOCUMENTS

| | | |
|---|---|---|
| CN | 1969059 A | 5/2007 |
| CN | 101063195 A | 10/2007 |
| CN | 101693991 A | 4/2010 |
| CN | 101906622 A | 12/2010 |
| CN | 101925980 A | 12/2010 |
| CN | 101949009 A | 1/2011 |
| CN | 102102194 A | 6/2011 |
| CN | 102317502 A | 1/2012 |
| JP | 62-222077 A | 9/1987 |
| JP | 2009-218301 A | 9/2009 |
| WO | 2011149678 A2 | 12/2011 |

OTHER PUBLICATIONS

Office Action for Korean Patent Application No. 10-2014-7027767 dated Dec. 10, 2015.
International Search Report and Written Opinion in International Application No. PCT/CN2013/073002, dated Jun. 27, 2013.

* cited by examiner

APPARATUS AND METHOD FOR CONTROLLING HEATING OF BASE WITHIN CHEMICAL VAPOUR DEPOSITION CHAMBER

The present application is a National Phase application of PCT International Application No. PCT/CN2013/073002, filed on Mar. 21, 2013, which claims the priority to Chinese Patent Application No. 201210077039.4, entitled "APPARATUS AND METHOD FOR CONTROLLING HEATING OF BASE WITHIN CHEMICAL VAPOUR DEPOSITION CHAMBER", and filed with the Chinese State Intellectual Property Office on Mar. 21, 2012, the entire disclosures of which are incorporated herein by reference.

FIELD

The present application relates to the field of semiconductor equipment, and particularly to an apparatus and a method for controlling heating of a substrate in a chemical vapor deposition chamber.

BACKGROUND

Metal Organic Chemical Vapor Deposition (MOCVD) is a new vapor epitaxial growth technology developing on a basis of a vapor epitaxial growth. MOVCD has advantages such as an easily controllable growth, a growable highly-purified material and a large area of an epitaxial layer with good uniformity.

An MOCVD reactor is a main process apparatus for manufacturing a high light LED chip. Reference is made to FIG. 1 which is a schematic structural view of an MOCVD reactor in the conventional technology, for example. The MOCVD reactor includes a chamber 10, a heater 11 located at the bottom of the chamber 10, and a tray 13 located above the heater 11. The tray 13 is associated with a rotating mechanism by a supporting structure 12. The tray 13 is configured to support a substrate 14. The MOCVD reactor further includes a feeder 15 located at the top of the chamber 10.

In a working process of the MOCVD reactor, the feeder 15 inputs a raw material gas including an organic metal into the chamber 10, and the heater 11 is configured to heat to make the raw material gas dissociate, thereby forming a film on a surface of the substrate 14.

A working temperature in the MOCVD reactor is generally in a range from 500 to 1200 degree Celsius. A temperature control system for controlling a current of the heater 11 is provided in the MOCVD reactor in the conventional technology, to achieve the working temperature of the MOCVD.

Reference is made to FIG. 2, which is a schematic view of a temperature control system of the MOCVD reactor in the conventional technology, for example. The temperature control system of the MOCVD reactor includes a temperature controller 16. The temperature controller 16 includes two input terminals and one output terminal. The first input terminal is configured to input a set temperature value. The second input terminal is coupled with an upper surface of the tray 13 in the chamber 10 and configured to obtain an actual temperature of the upper surface of the tray 13 (in this example, the upper surface of the tray supports the substrate 14, thus the actual temperature of the upper surface of the tray is approximately to be the actual temperature of the substrate 14). The output terminal is connected to a direct current power supply of a heater 11. The temperature controller 16 is configured to compare the set temperature value with the actual temperature and calculate a control signal based on a difference therebetween. The output terminal sends the control signal to the direct current power supply of the heater 11 to control the current of the direct current power supply, thus the power of the heater 11 is changed and the temperature of the upper surface of the tray 13 is approximately to be the set temperature value. In this case, a control to the temperature of the upper surface of the tray 13 is realized by the temperature controller 16.

However, the MOCVD reactor operates in a vacuum environment. In the vacuum environment, radiation is a main way for transferring heat. The duration of transferring heat in the metallic chamber with a large capacity is long, and thus the time constant is increased. In this case, transferring the heat generated by the heater 11 to the upper surface of the tray 13 requires a certain time, which causes a lag on the change of the temperature of the upper surface of the tray 13.

In a heating up process in the MOCVD reactor, the lag temperature of the upper surface of the tray 13 is inputted into the temperature controller 16, and the temperature controller 16 controls the heater 11 to increase the current of the direct current power supply, which causes the heater 11 to overly heat and thus the temperature of the upper surface of the tray 13 exceeds the set temperature value. The temperature controller 16 then controls the heater 11 to decrease the current of the direct current power supply, to make the temperature of the upper surface of the tray 13 be decreased to the set temperature value. The lag temperature of the upper surface of the tray 13 is inputted into the temperature controller 16, which causes the power of the heater 11, controlled by the temperature controller 16, to decrease, and thus the temperature of the upper surface of the tray 13 is less than the set temperature value. Therefore, a temperature oscillation occurs in the chamber 10.

For the MOCVD process, merely a temperature change of 1 degree Celsius will cause a yield decreasing of at least 5%. Thus, it is a technical problem for those skilled in the art to obtain a steady temperature of the substrate to increase the yield of the MOCVD process.

For more technical solutions about the temperature control of the MOCVD reactor, reference may be made to Chinese Patent Application with publication NO. CN101906622A, which also fails to address the technical problem above.

SUMMARY

An object of the present application is provide an apparatus and a method for controlling heating of a substrate in a chemical vapor deposition chamber, with which a temperature change is rapidly compensated by a temperature control unit with a high sensitivity in a manner of cascade control, thereby obtaining a steady temperature of the substrate.

For the object, an apparatus for controlling heating of a substrate in a chemical vapor deposition chamber is provided in the present application. The apparatus includes: a heater located in the chamber; a tray located near the heater and spaced apart from the heater in the chamber, and configured to support the substrate; a first temperature control unit, coupled with a surface of the tray which supports the substrate, and configured to measure a temperature of the surface of the tray and output a first control signal based on a set temperature and the temperature of the surface of the tray; and a second temperature control unit, connected to the first temperature control unit, and configured to measure an intermediate temperature of an area between the tray and the heater and output a second control signal based on the first control signal and the intermediate temperature; where the heater is coupled with the second temperature control unit and configured to heat based on the second control signal.

Optionally, a time constant of the second temperature control unit is less than a time constant of the first temperature control unit.

Optionally, a ratio of a time constant of the first temperature control unit to a time constant of the second temperature control unit is in a range from 1 to 25.

Optionally, the first temperature control unit includes a first temperature measurer, a first temperature setter, a first temperature controller and a signal converter. The first temperature measurer is connected with a first input terminal of the first temperature controller and is configured to measure a first actual temperature of the surface of the tray and send the first actual temperature to the first temperature controller; the first temperature setter is connected with a second input terminal of the first temperature controller and is configured to provide a set temperature value to the first temperature controller; the first temperature controller is configured to compare the first actual temperature with the set temperature value and output a first control signal based on a difference between the first actual temperature and the set temperature value; and the signal converter is connected with an output terminal of the first temperature controller and is configured to receive the first control signal, convert the first control signal into a set intermediate temperature and send the set intermediate temperature to the second temperature control unit.

Optionally, the signal converter is provided with a linear relationship or a non-linear relationship between the first control signal and the set intermediate temperature, and the signal converter is configured to receive the first control signal, convert the first control signal into a set intermediate temperature corresponding to the first control signal and send the set intermediate temperature to the second temperature control unit.

Optionally, the second temperature control unit includes a second temperature measurer and a second temperature controller. The second temperature measurer is located between the tray and the heater and connected with the second temperature controller, and is configured to measure a second actual temperature of a measuring point between the tray and the heater and send the second actual temperature to the second temperature controller; and the second temperature controller is connected with the signal converter, and is configured to compare the second actual temperature with the set intermediate temperature and output a second control signal based on a difference of the second actual temperature and the set intermediate temperature.

Optionally, the apparatus further includes a driving power supply connected with the second temperature controller and the heater, and the driving power supply is configured to receive the second control signal, supply a heater current based on the second control signal and input the heater current to the heater.

Optionally, the first temperature measurer is an optical temperature measurement instrument based on multi-wavelength.

Optionally, the first temperature controller is a temperature controller with a PI mode or a PID mode.

Optionally, the second temperature measurer is a thermocouple.

Optionally, the second temperature measurer is located at a position which is between the tray and the heater and closer to the heater.

Optionally, the second temperature measurer and a heat radiating surface of the heater are in a same plane.

Optionally, a bottom of the chamber is provided with an gas outlet configured to exhaust gas, and the second temperature measurer is located near the gas outlet.

Optionally, the second temperature controller is a temperature controller with a P mode.

Accordingly, a method for controlling heating of a substrate in a chemical vapor deposition chamber is provided in the present application. A heater and a tray are provided in the chemical vapor deposition chamber, the tray is located near the heater and spaced apart from the heater and is configured to support the substrate. The method includes the following steps: setting a set temperature value; measuring a first actual temperature of a surface of the tray which supports the substrate; generating a first control signal based on a difference between the set temperature value and the first actual temperature; converting the first control signal into a set intermediate temperature value; measuring a second actual temperature of an area between the surface of the tray and the heater; generating a second control signal based on a difference between the set intermediate temperature value and the second actual temperature; and controlling the heater to heat based on the second control signal.

Optionally, the second actual temperature reaches a steady state earlier than the first actual temperature.

Optionally, the step of measuring the first actual temperature of the surface of the tray which supports the substrate includes: measuring a first actual temperature of the surface of the tray by an optical temperature measurement instrument based on multi-wavelength.

Optionally, the step of generating the first control signal includes: calculating a first difference value between the set temperature value and the first actual temperature; and generating the first control signal corresponding to the first difference value based on a linear relationship or a non-linear relationship.

Optionally, the step of converting the first control signal into the set intermediate temperature value includes: converting the first control signal into a set intermediate temperature value corresponding to the first control signal based on a linear relationship or a non-linear relationship.

Optionally, the step of generating the second control signal includes: calculating a second difference value between the set intermediate temperature value and the second actual temperature; and generating the second control signal corresponding to the second difference value based on a linear relationship or a non-linear relationship.

Optionally, the step of controlling the heater to heat based on the second control signal includes: converting the second control signal into a heater current; and inputting the heater current into the heater.

Compared with the conventional technology, the present application has the following advantages.

The apparatus for controlling heating of a substrate in a chemical vapor deposition chamber according to the present application is provided with two connected temperature control units, and a temperature control system of cascade control is formed by the two temperature control units, to obtain a steady temperature of the substrate.

In an optional solution, a time constant of the second temperature control unit is less than a time constant of the first temperature control unit, that is, the second temperature control unit is more sensitive than the first temperature control unit. In a case that the temperature of the upper surface of the tray or the second actual temperature changes, the second temperature control unit with a higher sensitivity can rapidly control power change of the heater to compensate the temperature change, and thus the temperature of the substrate can be maintained.

In an optional solution, a ratio of the time constant of the first temperature control unit to the time constant of the second temperature control unit is in a range from 1 to 25. On one hand, a meaningless control and feedback from the second temperature control unit, which is due to excessive sensitivity of the second temperature control unit, can be prevented, on the other hand, the temperature change being not compensated by the second temperature control unit, which is due to insufficient sensitivity of the second temperature control unit, can be prevented.

In an optional solution, the signal converter is provided with a linear relationship or a non-linear relationship between the first control signal and the set intermediate temperature, and the signal converter converts the first control signal into a set intermediate temperature corresponding to the first control signal based on the linear relationship or the non-linear relationship. This converting way is simple and can increase response speed of the signal converter.

In an optional solution, the second temperature measurer is located at a position which is between the tray and the heater and closer to the heater. Therefore, the second temperature measurer becomes more sensitive to power change of the heater, and thus a rapid feedback and control can be performed based on the power change of the heater.

In an optional solution, a bottom of the chamber is provided with an gas outlet for exhausting gas and the second temperature measurer is located near the gas outlet. The second temperature measurer can compensate in time temperature change due to factors such as gas exhaust flow and gas exhaust speed at the gas outlet, thereby increasing anti-interference ability of the apparatus.

In an optional solution, the first temperature controller is a temperature controller with a PI mode or the second temperature controller is a temperature controller with a P mode, which can simplify the structure of the apparatus for controlling heating of the substrate in the chemical vapor deposition chamber and decrease cost.

DETAILED DESCRIPTION OF THE EMBODIMENTS

For clearly and easily understanding the objects, features and advantages of the present application, the embodiments of the present application are described in detail below in conjunction with the drawings.

Although many details are described hereinafter for sufficiently understanding the present application, the present application can be implemented by other embodiments which are different from those described herein, and thus the present application is not limited to what disclosed in the embodiments hereinafter.

Figure 1:
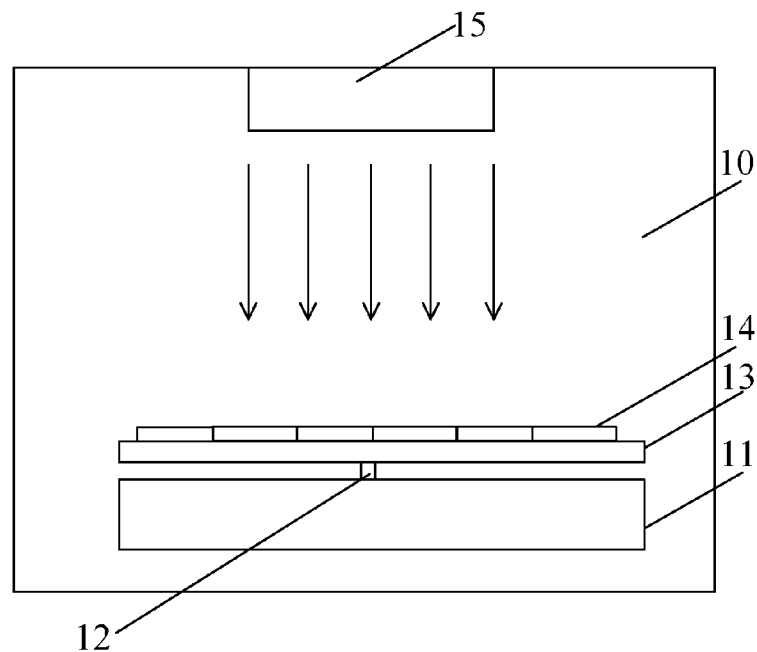
FIG. 1 is a schematic view of an example of an MOCVD reactor in the conventional technology.
Figure 2:
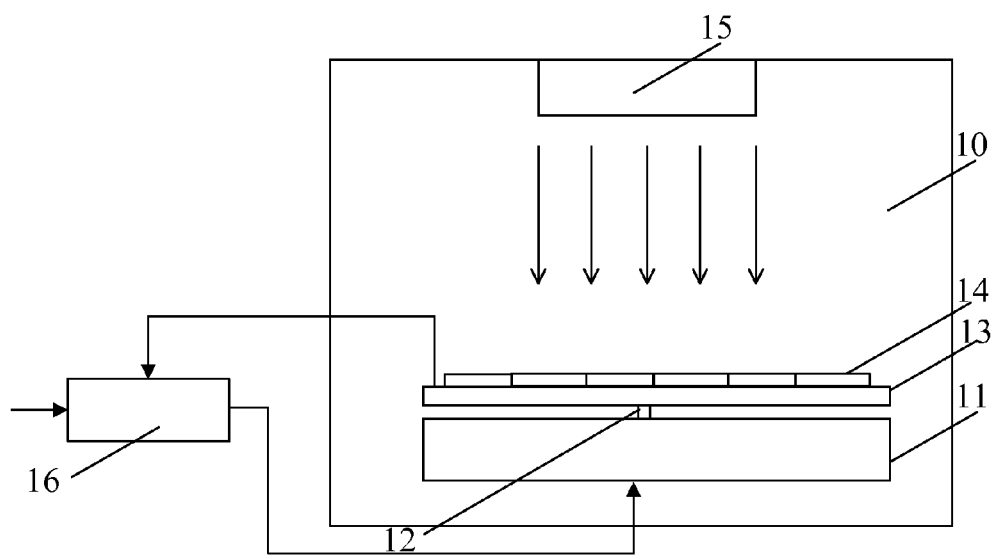
FIG. 2 is a schematic view of an example of a temperature control system of an MOCVD reactor in the conventional technology.
Figure 3:
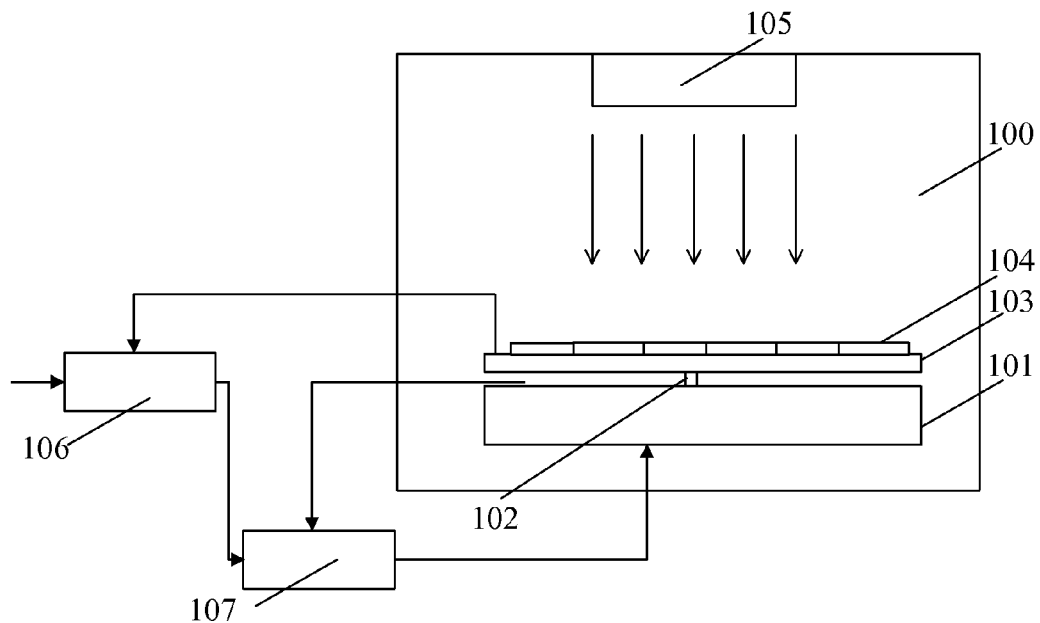
FIG. 3 is a schematic view of an embodiment of an apparatus for controlling heating of a substrate in a chemical vapor deposition chamber according to the present application.

In order to address the problem in the conventional technology, the present application provides an apparatus for controlling heating of a substrate in a chemical vapor deposition chamber. Reference is made to FIG. 3 which is a schematic view of an embodiment of the apparatus for controlling heating of a substrate in a chemical vapor deposition chamber according to the present application.

It should be noted that, the present application is described by taking a metallo-organic compound chemical vapor deposition chamber and an apparatus for controlling heating of a substrate therein as an example. However, the apparatus according to the present application is also adapted to other kinds of chemical vapor deposition chambers, which are not limited herein.

As shown in FIG. 3, an MOCVD reactor includes:

a chamber 100;

a heater 101 located at a bottom of the chamber 100;

a tray 103 located above the heater 101 and configured to support one or more substrates 104; where the tray 103 is connected to an outer rotating mechanism by a supporting structure 102, and the tray 103 is spaced apart from the heater 101 with a space ranging from 3 to 15 mm for example; and a reaction source feeder 105 located at the top of the chamber 100 and configured to input raw material gas.

The apparatus for controlling the substrate in the chemical vapor deposition chamber according to the present application includes the heater 101 and the tray 103, and further includes a first temperature control unit 106 and a second temperature control unit 107.

The first temperature control unit 106 is coupled with an upper surface of the tray 103, and configured to measure a temperature of the upper surface of the tray 103 and output a first control signal based on a set temperature and the temperature of the upper surface of the tray 103.

The second temperature control unit 107 is connected to the first temperature control unit 106, and configured to measure an intermediate temperature of an area between the tray 103 and the heater 101 and output a second control signal based on the first control signal and the intermediate temperature.

The heater 101 is coupled with the second temperature control unit 107 and configured to heat according to the second control signal.

In this embodiment, a time constant of the second temperature control unit 107 is less than that of the first temperature control unit 106.

The time constant herein refers to a time spent in rising a temperature to a preset proportion (for example 80%) of a preset temperature under a control of a temperature control unit. The preset proportion is generally determined in advance by a person according to industry requirement and experience. The larger the time constant is, the lower sensitivity of the temperature control unit is; and the less the time constant is, the higher sensitivity of the temperature control unit is.

The apparatus for controlling heating of the substrate in the chemical vapor deposition chamber according to the present application is at least provided with two temperature control units and the two temperature control units achieve a cascade control. The time constant of the second temperature control unit 107 is less than that of the first temperature control unit 106, that is, the second temperature control unit 107 is more sensitive than the first temperature control unit 106.

Since the upper surface of the tray 103 is far from the heater 101, the heat radiated from the heater 101 firstly reaches to an area between the tray 103 and the heater 101 and then to the upper surface of the tray 103. Therefore, the intermediate temperature can reflect power change of the heater 101 earlier than the temperature of the upper surface of the tray 103.

During a process of temperature rise, the first temperature control unit 106 slowly controls the temperature to be risen, and the intermediate temperature quickly reaches a steady state under the control of the second temperature control unit 107. Then the first temperature control unit 106 continually increases the first control signal slowly, and the second temperature control unit 107 makes the intermediate temperature quickly reach the steady state again under the control of the first control signal, in this way, the temperature continually rises until the temperature of the upper surface of the tray 103 reaches the set temperature.

Since the second temperature control unit 107 controls the temperature based on the first control signal, the intermediate temperature will not exceed a temperature corresponding to the first control signal when reaching a steady state under the control of the second temperature control unit 107, therefore severe oscillation of the temperature of the upper surface of the tray 103 will not occur, which enhances the stability of the temperature of the substrate.

Furthermore, during a process of temperature maintaining, the intermediate temperature may change due to a temperature interference factor, and the second temperature control unit 107 with a higher sensitivity quickly controls power change of the heater 101, to compensate the temperature change caused by the temperature interference factor and maintain the temperature of the substrate.

Therefore, with the apparatus for controlling heating of the substrate in the chemical vapor deposition chamber according to the present application, the temperature of the substrate in the chamber stays steady and is not changed greatly no matter in a temperature rising process or in a temperature maintaining process, which facilitates increasing of a yield of a process in the chamber.

It should be noted that, in a case that the time constant of the second temperature control unit 107 is much less than that of the first temperature control unit 106, that is, the second temperature control unit 107 is too sensitive, a feedback action for control of the second temperature control unit 107 is too fast, and even a small change of the first control signal causes the second temperature control unit 107 to perform multiple meaningless feedbacks and controls, which is not benefit to temperature stability of the whole substrate.

In the contrary, in a case that the time constant of the second temperature control unit 107 is close to or larger than that of the first temperature control unit 106, dynamic adjustment effect of the second temperature control unit 107 decreases, influence of the temperature interference factory can not be eliminated in time, and even an phenomenon of coupling resonance between the first temperature control unit 106 and the second temperature control unit 107 may occur, therefore, the apparatus for heating the substrate in the chemical vapor deposition chamber can not work normally.

Therefore, the ratio of the time constant of the first temperature control unit 106 to the time constant of the second temperature control unit 107 ranges from 1 to 25. Preferably, the time constant ratio ranges from 3 to 10.

The technical solution of the present application is further described in detail below in conjunction with embodiments.

Figure 4:
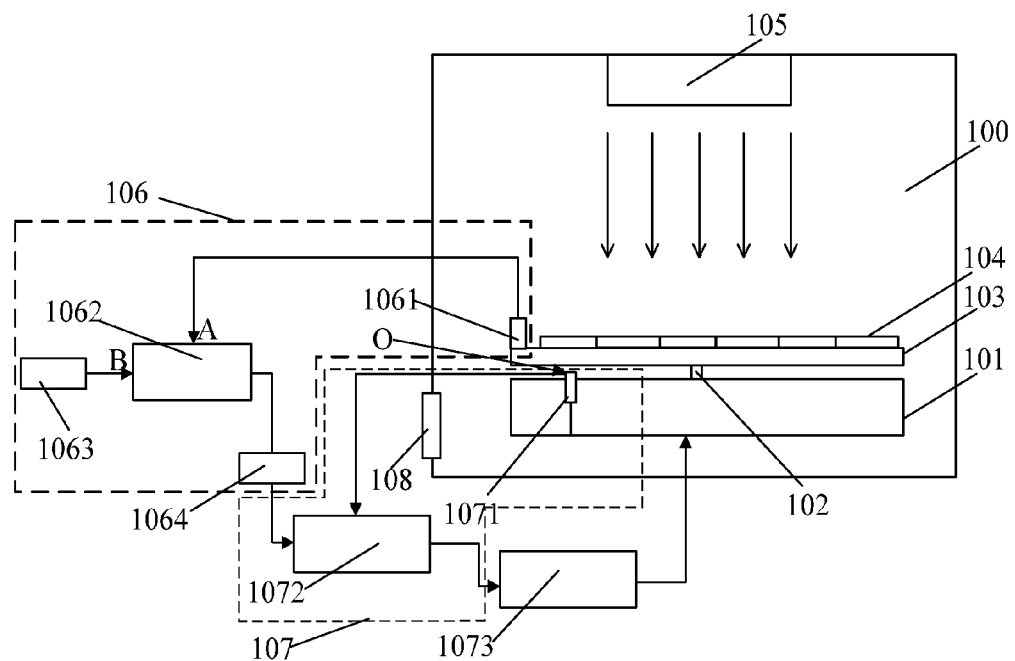
FIG. 4 is a schematic view of an embodiment of the apparatus for controlling heating of the substrate in the chemical vapor deposition chamber according to the present application.

Reference is made to FIG. 4, which is a schematic view of an embodiment of the apparatus for controlling heating of the substrate in the chemical vapor deposition chamber according to the present application. It should be noted that, the components in FIG. 4 are just for illustration and the positions of the components are not limited therein.

The first temperature control unit 106 in this embodiment includes a first temperature measurer 1061, a first temperature setter 1063, a first temperature controller 106 and a signal converter 1064. The second temperature control unit 107 includes a second temperature measurer 1071 and a second temperature controller 1072.

The first temperature measurer 1061 is connected with a first input terminal A of the first temperature controller 1062 for measuring a first actual temperature of the upper surface of the tray 103 (the upper surface of the tray 103 is a tray surface for supporting the substrate 104 in the embodiment) and sending the first actual temperature to the first temperature controller 1062. In this embodiment, the upper surface of the tray 103 is a tray surface for supporting the substrate 104 and is in contact with the substrate 104, therefore, the temperature of the upper surface of the tray 103 and temperature of the substrate 104 are the same.

Preferably, for rapidly and accurately obtaining the actual temperate of the upper surface of the tray 103, the first temperate measurer 1061 is an optical temperature measurement instrument based on multi-wavelength which has a high accuracy. Specifically, the optical temperature measurement instrument is a non-contact temperature measurement instrument, and the measuring probe of the optical temperature measurement instrument is located above the tray 103 and has a distance of 1-17 cm from the upper surface of the tray 103.

It should be noted that, the optical temperature measurement instrument based on multi-wavelength in the embodiment is a non-contact temperature measurement instrument, which is not limited herein. In other embodiments, the first temperature measurer 1061 may be other non-contact temperature optical temperature measurement instrument or contact temperature optical temperature measurement instrument, which is not limited herein.

The first temperature setter 1063 is connected with a second input terminal B of the first temperature controller 1062 for providing a set temperature value to the first temperature controller 1062. The first temperature setter 1063 provides a human-computer interface which is adapted for research personals or process operators to set temperature. For the MOCVD reactor, the set temperature value is generally in a range from 500 to 1200 degree Celsius. For example, the set temperature value is 500 degree Celsius.

It should be noted that, the first temperature setter 1063 may be an independent hardware device or may be software which is integrated into the first temperature controller 1062 and has the same function, which is not limited herein.

The first temperature controller 1062 is configured to compare the first actual temperature with the set temperature value and output a first control signal based on a difference between the first actual temperature and the set temperature value.

Specifically, the first temperature controller 1062 is configured to firstly calculate a first difference value between the first actual temperature and the set temperature value, and obtain a first control signal corresponding to the first difference value based on the first difference value. In this embodiment, the first control signal has a linear relationship with the first difference value. Specifically, the first control signal is directly proportional to the first difference value.

In this embodiment, the first control signal is a percentage control signal corresponding to a set intermediate temperature. For example, the percentage control signal of the first temperature measurer 1061 has a range from 0 to 100%, and the corresponding set intermediate temperature ranges from 0 to 1200 degree Celsius. In other embodiments, the first control signal may be a voltage control signal.

Generally, the percentage control signal has a linear relationship with the set intermediate temperature. However, the relationship is not limited in the present application, and the percentage control signal may have a non-linear relationship with the set intermediate temperature.

The first temperature controller 1062 may be a temperature controller with a PID mode, which includes a proportion unit (P), an integration unit (I) and a differentiation unit (D).

The first temperature controller 1062 should have a characteristic of steady-state error, and the apparatus for heating of the substrate in the chemical vapor deposition chamber according to the present application can realize a steady temperature control of the upper surface of the tray 103 by a cascade control. Therefore, the first temperature controller 1062 may not be provided with the integration unit (I) which can decrease steady-state error. Preferably, the first temperature controller 1062 may be a temperature controller with a PI mode, that is, the first temperature controller 1062 may only include the proportion unit (P) and the integration unit (I), thereby simplifying the structure of the apparatus for controlling heating of the substrate in the chemical vapor deposition chamber and decreasing cost.

The signal converter 1064 is connected with an output terminal of the first temperature controller 1062 for receiving the first control signal, converting the first control signal into a set intermediate temperature and sending the set intermediate temperature to the second temperature control unit 107.

The signal converter 1064 is provided with a linear relationship between the first control signal and the set intermediate temperature. The signal converter 1064 converts the first control signal into a set intermediate temperature corresponding to the first control signal based on the linear relationship between the percentage control signal and the set intermediate temperature and send the set intermediate temperature to the second temperature control unit 107.

The signal converter 1064 is provided with a linear relationship between the first control signal and the set intermediate temperature, which makes the converting simple and efficient, therefore, the signal converter 1064 has a high response speed in the embodiment. The relationship between the first control signal and the set intermediate temperature is not limited herein. The relationship between the first control signal and the set intermediate temperature may also be a non-linear relationship, for example, an exponential relationship or a mapping relationship.

The second temperature measurer 1071 is located between the tray 103 and the heater 101 for measuring a second actual temperature of a measuring point O between the tray 103 and the heater 101.

Compared with the upper surface of the tray 103, the measuring point O between the tray 103 and the heater 101 is closer to the heater 101, thus the second actual temperature of the measuring point O is more sensitive to power change of the heater 101 and reflects the power change of the heater 101 earlier. The second temperature control unit 107, which performs a control based on the second actual temperature, can decrease the influence of the power change of the heater 101 on the temperature of the upper surface of the tray 103.

The closer the second temperature measurer 1071 is to the heater 101, the more sensitive the second actual temperature is to the power change of the heater 101. Preferably, the second temperature measurer 1071 and a heat radiating surface of the heater 101 are in a same plane.

The second temperature measurer 1071 may be a thermocouple or other temperature measurement instrument (contact or non-contact temperature measurement instrument), which is not limited herein.

Figure 5:
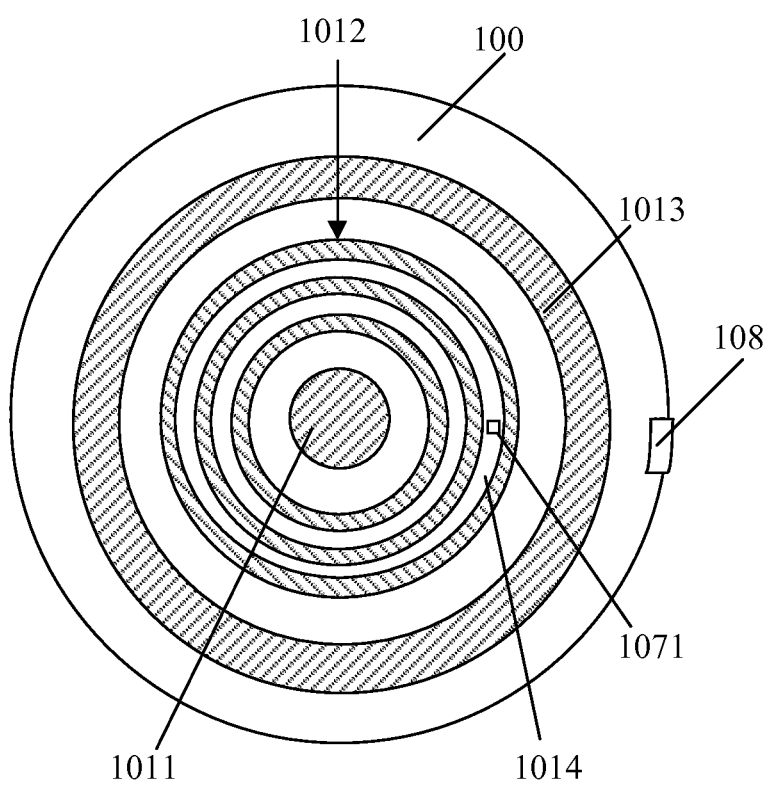
FIG. 5 is a schematic view of an embodiment of a heater and a second temperature measurer of the apparatus for controlling heating of the substrate in the chemical vapor deposition chamber of FIG. 4.

Reference is made to FIG. 5, which is a schematic view of an embodiment of the heater 101 and the second temperature measurer 1071 in FIG. 4.

FIG. 5 is a top view of the heater 101. Generally, the substrate 104 is a wafer and the heater 101 in this embodiment has a round structure, accordingly.

The heater 101 is a circular heating component concentrically arranged, including an inner area heating component 1011 which is close to a center of the circle, an outer area heating component 1013 which is far from the center of the circle, and an intermediate area heating component 1012 which is located between the inner area heating component 1011 and the outer area heating component 1013.

It should be noted that, for concision of the drawings, only the inner area heating component 1011, the intermediate area heating component 1012 and the outer area heating component 1013 are illustrated in FIG. 5. The inner area heating component 1011, the intermediate area heating component 1012 and the outer area heating component 1013 further respectively includes several circular components. The intermediate area heating component 1012 has a largest area, corresponds to a largest area of the wafer, and supplies the most heat. In this embodiment, the second temperature measurer 1071 is located at a place corresponding to the intermediate area heating component 1012.

It should be noted that, the first temperature measurer 1061 may be configured to measure a temperature of any position of the upper surface of the tray 103. The second temperature measurer 1071 may measure a temperature of any area. In other embodiments, the second temperature measurer 1071 may be arranged at the inner area heating component 1011 or the outer area heating component 1012, which is not limited herein.

It should be noted that, the second temperature measurer 1071 may be a thermocouple which is fixed by a supporting structure located on the bottom of the chamber 100. The supporting structure passes through an interval area 1014 between the rings of the circular heating component shown in FIG. 5, to cause the measuring point O of the thermocouple to be located between the heater 101 and the tray 103.

Reference is still made to FIG. 5, the heater 101 is located at a center of the bottom of the chamber 100, and an gas outlet 108 for exhausting gas is further provided on the bottom of the chamber 100. The temperature change is significant at the gas outlet 108 due to factors such as gas exhaust flow and gas exhaust speed.

In this embodiment, the second temperature measurer 1071 is arranged on the intermediate area heating component 1012 which is close to the gas outlet 108, therefore, in a case that the temperature changes due to temperature interference factors such as gas exhaust flow and gas exhaust speed, the second temperature control unit 107 can compensate the temperature change in time, to decrease the influence of the temperature change on the temperature of the upper surface of the tray 103.

It should be noted that, the temperature interference factor includes one or more of gas exhaust flow, gas exhaust speed, rotating of the tray, stress in the chamber and cooling water flow. The second temperature measurer 1071 may be located at a position which is affected by most temperature interference factors, thereby compensating the influence of the multiple interference factors on the temperature of the substrate.

Reference is still made to FIG. 4. The second temperature controller 1072 is connected with the signal converter 1064 and the second temperature measurer 1071 and is configured to compare the second actual temperature with the set intermediate temperature and output a second control signal based on a difference between the second actual temperature and the set intermediate temperature.

Specifically, the second temperature controller 1072 is configured to firstly calculate a second difference value between the second actual temperature and the set intermediate temperature, and obtain a second control signal corresponding to the second difference value based on the second difference value. In this embodiment, the second control signal has a linear relationship with the second difference value. Specifically, the second control signal is directly proportional to the second difference value. In other embodiments, the second control signal may have a non-linear relationship with the second difference value.

In this embodiment, the second control signal is a percentage control signal which is directly proportional to the second difference value. The percentage control signal has a range from 0 to 100%. In other embodiments, the second control signal may be a voltage control signal.

The second temperature controller 1072 may be a temperature controller with a PID mode, which includes a proportion unit (P), an integration unit (I) and a differentiation unit (D).

The second temperature controller 1072 should have a characteristic of high sensitivity so that rapid adjustment can be achieved. Therefore, the second temperature controller 1072 may not be provided with an integration unit (I) which is for decreasing a steady-state error or a differentiation unit (D) which is for restraining oscillation. Preferably, the second temperature controller 1072 may be a temperature controller in a P mode, that is, the second temperature controller 1072 only includes a proportion unit (P), thereby simplifying structure and decreasing cost.

The apparatus for controlling heating of the substrate in the chemical vapor deposition chamber may further include a driving power supply 1073. The driving power supply 1073 is connected to the output terminal of the second temperature controller 1072 and the heater 101, and is configured to receive the second control signal, supply a heater current based on the second control signal and input the heater current to the heater 101.

In this embodiment, the second control signal is a percentage signal which is directly proportional to the heater current. The driving power supply 1073 obtains the heater current based on the second control signal and the directly proportional relationship, and supply the heater current to the heater 101, to cause the heater 101 to heat based on the heater current. In other embodiments, the second control signal may have a non-linear relationship with the heater current, which is not limited herein.

The technical solution of the apparatus for controlling heating of the substrate in the chemical vapor deposition chamber as shown in FIG. 4 is further illustrated in conjunction with a heating up process.

Firstly, a set temperature value of 500 degree Celsius is set by the first temperature setter 1063, the temperature of the upper surface of the tray 103 measured by the first temperature measurer 1061 is a room temperature (25 degree Celsius), and a first control signal is output by the first temperature controller 1062 based on a temperature difference of 475 degree Celsius (a difference value between 500 degree Celsius and 25 degree Celsius).

The first control signal of the first temperature controller 1062 is in a range of 0-100%, which corresponds to a temperature range of 0-1200 degree Celsius. Accordingly, a first control signal corresponding to 475 degree Celsius is 39%.

The first control signal gradually increases from 0, for example, to 5%. The signal converter 1064 converts the first control signal of 5% into a set intermediate temperature. Accordingly, the set intermediate temperature corresponding to 5% is 60 degree Celsius.

In this case, the second actual temperature measured by the second temperature measurer 1071 is a room temperature of 25 degree Celsius. The second temperature controller 1072 outputs a second control signal based on a difference value of 35 degree Celsius between the second actual temperature and the set intermediate temperature (a difference value between 60 degree Celsius and 25 degree Celsius).

The second temperature controller 1072 has a higher sensitivity, therefore, for a same temperature difference, the second control signal of the second temperature controller 1072 is much greater than the first control signal of the first temperature controller 1062. In this embodiment, the second temperature controller 1072 outputs a second control signal of 20% based on the difference value of 35 degree Celsius.

For the driving power supply 1073, the second control signal which is in a range of 0-100% corresponds to the heater current which is in a range of 0-250 A, therefore, in response to the second control signal of 20%, the driving power supply 1073 outputs a heater current of 50 A to control the heater 101 to heat.

After a period of time, the first actual temperature is 26 degree Celsius, and the second actual temperature reaches 30 degree Celsius since the second temperature controller 1072 has a high sensitivity and a rapid temperature rise. After that, when the first actual temperature reaches 30 degree Celsius, the second actual temperature reaches 55 degree Celsius. Because the second actual temperature is risen faster than the first actual temperature, the second actual temperature rapidly reaches a steady state close to the set intermediate temperature. Since the set intermediate temperature is restricted by the first actual temperature, the second actual temperature will not be changed significantly.

With the gradual increase of the first control signal, the second actual temperature continuously reaches a steady state. The heating up process is finished until the first actual temperature of the upper surface of the tray 103 reaches a steady state of 500 degree Celsius.

It should be noted that, in the embodiments of FIGS. 4 and 5, the apparatus for controlling heating of the substrate in the chemical vapor deposition chamber is provided with only one temperature control system of cascade control, and it is not limited herein. In other embodiments, the apparatus for controlling heating of the substrate in the chemical vapor deposition chamber may include multiple temperature control systems of cascade control. The first temperature controller of each temperature control system is configured to measure the temperature of different position of the upper surface of the tray, and accordingly, the second temperature controller is configured to measure the temperature of different area (the inner area, the intermediate area or the outer area), therefore, the temperature can be measured and controlled by different temperature control systems independently, to adjust the temperature of different position of the upper surface of the tray.

It should be noted that, in the above embodiments of the apparatus for controlling heating of the substrate in the chemical vapor deposition chamber, the heater is located at the bottom of the heater, the tray is located above the heater, the upper surface of the tray is in contact with the substrate, and the first temperature control unit is coupled with the upper surface of the tray. However, the above is not limited herein. In other embodiments, the heater may be arranged along a vertical direction, and the tray may be arranged near the heater and spaced apart from the heater (for example, the tray is also arranged along the vertical direction and is arranged parallel to the heater); the temperature of the surface of the tray for supporting the substrate is the same as that of the substrate, and the first temperature control unit is coupled with the surface of the tray for supporting the substrate to obtain the temperature of the surface of the tray, so as to control the temperature of the substrate.

In view of the above, the apparatus for controlling heating of the substrate in the chemical vapor deposition chamber is provided in the present application, the apparatus is provided with a temperature control system of cascade control formed by a first temperature control unit and a second temperature control unit with the second temperature control unit having a higher sensitivity and being capable of achieving a function of rapid and timely adjustment, which can improve the dynamic characteristic of the heater, decrease the influence of a capacity lag on the heating up process and weaken temperature oscillation, thereby increasing stability of the substrate temperature.

In addition, there may be different process growth stages in the chemical vapor deposition chamber and thus different growth environments, for example, parameters such as cavity pressure, gas flow and rotating speed of the tray, are set, and combined with outer environment factors such as fluctuation of cooling water flow, disturbance will occur to the accuracy of the temperature control. The rapid and timely adjustment function of the temperature control system of cascade control has a strong ability for restraining the disturbance and can greatly weaken the influence of the disturbance on the temperature.

In addition, the heater in the chemical vapor deposition chamber is made of special heat-resisting and conductive material. The resistance of the material non-linearly changes as the ambient temperature increases, and the power consumed by the heater changes under a same heater current, thereby affecting the accuracy of temperature control. Because of the second temperature control unit of the temperature control system of cascade control has the rapid and timely adjustment function and thus certain adaptivity, the influence of the non-linear change of the material resistance on the dynamic characteristic of the substrate temperature can be compensated to some extent.

Accordingly, a method for controlling heating of a substrate in a chemical vapor deposition chamber is further provided according to the present application. A heater and a tray are provided in the chemical vapor deposition chamber, the tray is located near the heater and spaced apart from the heater and is configured to support the substrate. The temperature of a surface of the tray for supporting the substrate is the same as the temperature of the substrate.

Figure 6:
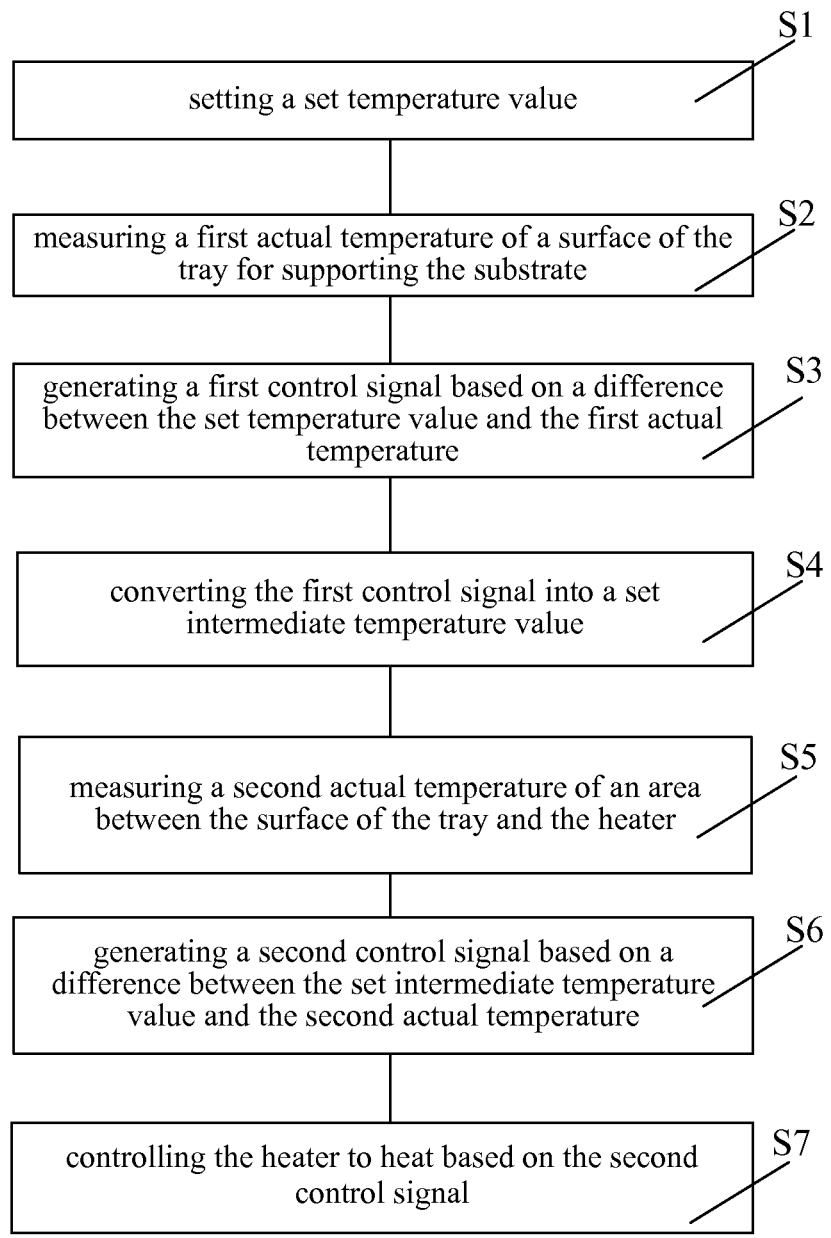
FIG. 6 is a flow chart of an embodiment of a method for controlling heating of a substrate in a chemical vapor deposition chamber according to the present application.

Reference is made to FIG. 6, which is a flow chart of an embodiment of the method for controlling heating of the substrate in the chemical vapor deposition chamber according to the present application. The method mainly includes the following S1 to S7.

S1 may include, setting a set temperature value.

S2 may include, measuring a first actual temperature of the surface of the tray for supporting the substrate.

S3 may include, generating a first control signal based on a difference between the set temperature value and the first actual temperature.

S4 may include, converting the first control signal into a set intermediate temperature value.

S5 may include, measuring a second actual temperature of an area between the surface of the tray and the heater.

S6 may include, generating a second control signal based on a difference between the set intermediate temperature value and the second actual temperature.

S7 may include, controlling the heater to heat based on the second control signal. In the application, the temperature control is realized by cascade control and a steady temperature of the substrate can be obtained.

Preferably, the second actual temperature reaches a steady state earlier than the first actual temperature. In this case, temperature change is compensated rapidly by the second actual temperature which rapidly reaches the steady state. Therefore, the first actual temperature becomes steady, that is, the temperature of the substrate becomes steady.

The technical solution of the present application is further described in detail below in conjunction with specific embodiments.

In S1, a set temperature value is set. The temperature of the substrate in the MOCVD reactor is generally in a range of 500-200 degree Celsius. For example, the set temperature value is set to be 500 degree Celsius.

In S2, a first actual temperature of the surface of the tray for supporting the substrate may be measured by an optical temperature measurement instrument based on multi-wavelength, to obtain an accurate temperature of the surface of the tray.

In S3, a first control signal is generated based on a difference between the set temperature value and the first actual temperature. Specifically, S3 includes the following sub-steps:

calculating a first difference value between the set temperature value and the first actual temperature; and generating the first control signal corresponding to the first difference value based on a linear relationship.

It should be noted that, in other embodiments, the first difference value may have a non-linear relationship with the first control signal, and in this case, the step of generating the first control signal may include: generating the first control signal corresponding to the first difference value based on the non-linear relationship.

In this embodiment, the first control signal has a linear relationship with the first difference value, which simplifies the generation of the first control signal and increases a response speed.

In S4, the first control signal is converted into a set intermediate temperature value. Specifically, the first control signal may be converted into a set intermediate temperature value corresponding to the first control signal based on a linear relationship, which simplifies the conversion and increases a response speed.

It should be noted that, in other embodiments, the first control signal may have a non-linear relationship with the set intermediate temperature value. In converting the signal, the first control signal is converted into a set intermediate temperature value corresponding to the first control signal based on the non-linear relationship.

In S5, a second actual temperature of an area between the surface of the tray and the heater is measured by a thermocouple.

In S6, the step of generating the second control signal includes the following sub-steps:

calculating a second difference value between the set intermediate temperature value and the second actual temperature; and generating a second control signal corresponding to the second difference value based on a linear relationship.

In this embodiment, the second control signal has a linear relationship with the second difference value, which simplifies the generation of the second control signal and increases a response speed.

It should be noted that, in other embodiments, the second difference value may have a non-linear relationship with the second control signal, and in this case, the step of generating the second control signal may include: generating the second control signal corresponding to the second difference value based on the non-linear relationship.

In S7, the heater power is controlled by controlling the heater current in this embodiment. Specifically, the step of controlling the heater to heat based on the second control signal includes the following sub-steps:

converting the second control signal into a heater current; and inputting the heater current into the heater.

It should be noted that, the second control signal also have a linear relationship with the heater current in S7, which simplifies the conversion.

The present application is disclosed by the preferable embodiments above which should not be interpreted as limitation to the present application. Changes and modifications may be made to the technical solutions of the present application by those skilled in the art based on the method and technical contents disclosed above without departing from the spirit and scope of the present application. Therefore, simple changes, equivalent variations and modifications made to the embodiments above based on technical essence of the invention without departing from the contents of the technical solutions of the invention all fall within the protection scope of the present application.

The invention claimed is:

1. An apparatus for controlling heating of a substrate in a chemical vapor deposition chamber, comprising:
   a heater located in the chamber;
   a tray located near the heater and spaced apart from the heater in the chamber, and configured to support the substrate;
   a first temperature control unit, coupled with a first temperature measurer, the first temperature measurer configured to measure a first actual temperature of a surface of the tray, the first temperature control unit configured to generate a first control signal based on a set temperature value and the first actual temperature of the surface of the tray and convert the first control signal into a set intermediate temperature; and
   a second temperature control unit, connected to the first temperature control unit and to a second temperature measurer, the second temperature measurer configured to measure a second actual temperature of an area between the tray and the heater, the second temperature control unit configured to output a second control signal based on the set intermediate temperature and the second actual temperature,
   wherein the heater is coupled with the second temperature control unit and configured to heat based on the second control signal.

2. The apparatus according to claim 1, wherein a time constant of the second temperature control unit is less than a time constant of the first temperature control unit.

3. The apparatus according to claim 1, wherein a ratio of a time constant of the first temperature control unit to a time constant of the second temperature control unit is in a range from 1 to 25.

4. The apparatus according to claim 1, wherein
   the first temperature control unit comprises a first temperature setter, a first temperature controller and a signal converter, wherein
   the first temperature measurer is connected with a first input terminal of the first temperature controller and is configured to measure the first actual temperature of the surface of the tray and send the first actual temperature to the first temperature controller;
   the first temperature setter is connected with a second input terminal of the first temperature controller and is configured to provide the set temperature value to the first temperature controller;
   the first temperature controller is configured to compare the first actual temperature with the set temperature value and output the first control signal based on a difference between the first actual temperature and the set temperature value; and
   the signal converter is connected with an output terminal of the first temperature controller and is configured to receive the first control signal, convert the first control signal into the set intermediate temperature and send the set intermediate temperature to the second temperature control unit.

5. The apparatus according to claim 4, the signal converter is provided with a linear relationship or a non-linear relationship between the first control signal and the set intermediate temperature, and the signal converter is configured to receive the first control signal, convert the first control signal into the set intermediate temperature corresponding to the first control signal and send the set intermediate temperature to the second temperature control unit.

6. The apparatus according to claim 4, wherein the second temperature control unit comprises a second temperature controller,
   the second temperature measurer is located between the tray and the heater and connected with the second temperature controller, and is configured to measure the second actual temperature of a measuring point between the tray and the heater and send the second actual temperature to the second temperature controller; and the second temperature controller is connected with the signal converter, and is configured to compare the second actual temperature with the set intermediate temperature and output the second control signal based on a difference between the second actual temperature and the set intermediate temperature.

7. The apparatus according to claim 6, wherein the apparatus further comprises a driving power supply connected with the second temperature controller and the heater, and the driving power supply is configured to receive the second control signal, supply a heater current based on the second control signal and input the heater current to the heater.

8. The apparatus according to claim 4, wherein the first temperature measurer is an optical temperature measurement instrument based on multi-wavelength.

9. The apparatus according to claim 6, wherein the second temperature measurer is a thermocouple.

10. The apparatus according to claim 6, wherein the second temperature measurer is located at a position which is between the tray and the heater and closer to the heater.

11. The apparatus according to claim 6, wherein the second temperature measurer and a heat radiating surface of the heater are in a same plane.

12. The apparatus according to claim 6, wherein a bottom of the chamber is provided with an gas outlet configured to exhaust gas, and the second temperature measurer is located near the gas outlet.

13. The apparatus according to claim 6, wherein the second temperature controller is a temperature controller with a P mode.

\* \* \* \* \*